United States Patent [19]
Howells

[11] Patent Number: 5,214,685
[45] Date of Patent: May 25, 1993

[54] X-RAY LITHOGRAPHY MIRROR AND METHOD OF MAKING SAME

[75] Inventor: Malcolm R. Howells, Berkeley, Calif.

[73] Assignee: Maxwell Laboratories, Inc., San Diego, Calif.

[21] Appl. No.: 772,906

[22] Filed: Oct. 8, 1991

[51] Int. Cl.[5] ............................................. G21K 5/00
[52] U.S. Cl. ..................................... 378/34; 378/84; 359/846; 359/867
[58] Field of Search ................... 378/34, 36, 43, 84; 350/607, 628, 629

[56] References Cited

U.S. PATENT DOCUMENTS

| | | | |
|---|---|---|---|
| 4,028,547 | 6/1977 | Eisenberger | 250/272 |
| 4,429,953 | 2/1984 | Zehnpfennig et al. | 350/293 |
| 4,799,747 | 1/1989 | Yamakawa | 350/6.8 |
| 4,803,713 | 2/1989 | Fujii | 378/34 |
| 4,850,663 | 7/1989 | Yamamoto et al. | 350/6.8 |
| 4,971,411 | 11/1990 | Takanashi | 350/6.5 |
| 5,003,567 | 3/1991 | Hawryluk et al. | 378/34 |
| 5,063,586 | 11/1991 | Jewell et al. | 378/34 |

FOREIGN PATENT DOCUMENTS

| | | |
|---|---|---|
| 0109193 | 5/1984 | European Pat. Off. . |
| 0068538 | 9/1983 | Japan . |
| 0068539 | 9/1983 | Japan . |
| 2274716 | 5/1986 | Japan . |
| 3236948 | 3/1987 | Japan . |

OTHER PUBLICATIONS

*Seiscor Advertisement* (1968).
Cerrina, F., "Ray Tracing of Recent VUV Monochromator Designs", *Proc. SPIE*, 503:68-77 (1984).
Jones, R. A., "Final Figuring of a Lightweighted Beryllium Mirror", *Proc. SPIE*, 65:48-51 (1975).
Kastner, et al.; "Image Construction for Concave Gratings at Grazing Incidence, by Ray Tracing", *J. Opt. Soc. Am.*, 53(10):1180-1184 (1963).
Malacara, et al.; "Diamond Tool Generation of Toroidal Surfaces", *Applied Optics*, 10(4):975-977 (1971).
Noda, et al.; "Geometric Theory of the Grating", *J. Opt. Soc. Am.*, 64(8):1031-1036 (1974).
Hopkins, et al.; "Creative Thinking and Computing Machines in Optical Design", *J. Opt. Soc. Am.*, 52(2):172-176 (1962).

*Primary Examiner*—David P. Porta
*Attorney, Agent, or Firm*—Fitch, Even, Tabin & Flannery

[57] ABSTRACT

A polished aspheric mirror focusses a fan X-ray beam from a point source onto a work piece as a straight image line. The work piece can be efficiently exposed to the X-ray beam by simply tilting the aspheric mirror about a rotational axis, causing the focused image line to sweep across the workpiece. The aspheric mirror is designed to collimate the beam in one direction, e.g., the horizontal direction, and focus the beam in the other direction, e.g., the vertical direction, thereby creating the focused image line at the workpiece. This process is achieved by representing the mirror surface as at least a fourth order Maclaurin series polynomial, and by adjusting the coefficients of such Maclaurin series to create and maintain the desired straight image line. The mirror surface is then polished using computer controlled polishing techniques to realize the designed shape.

17 Claims, 4 Drawing Sheets

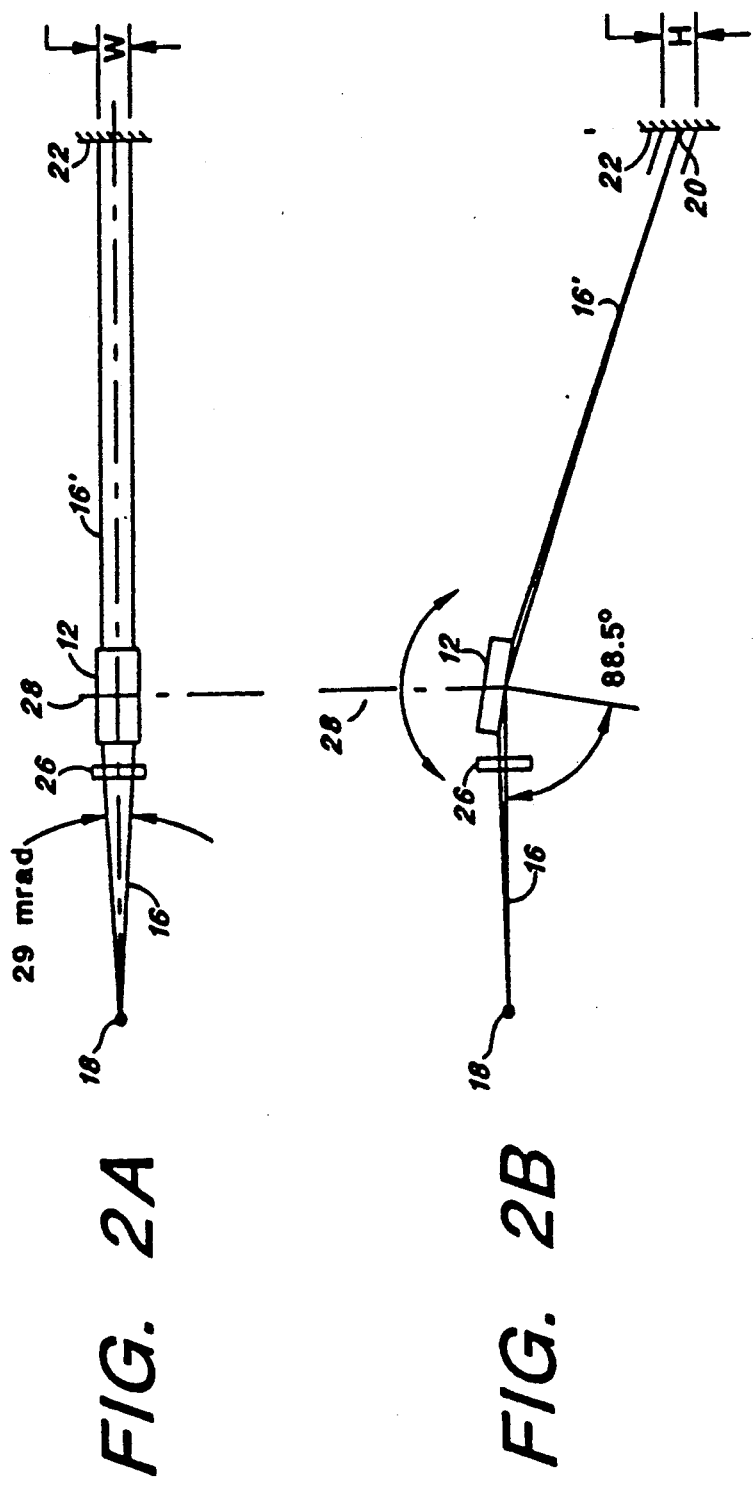

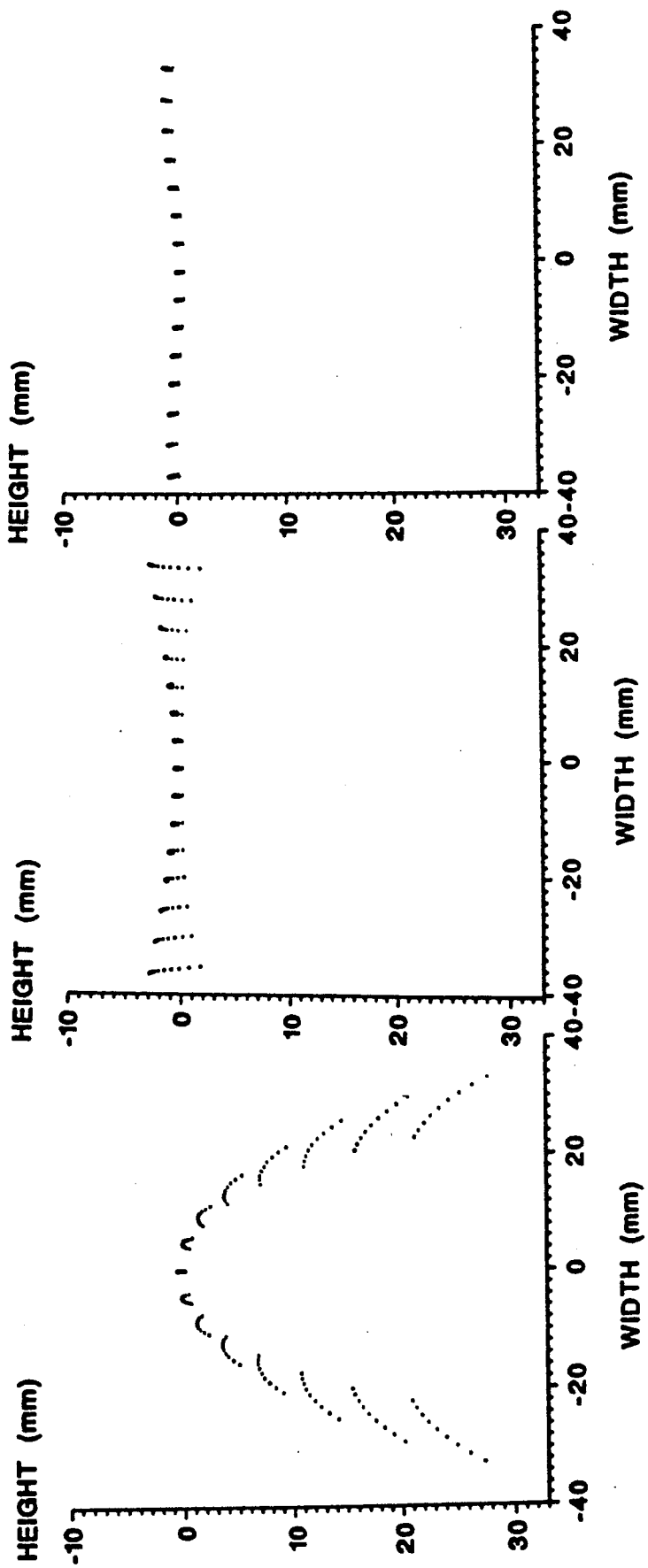

X-RAY LITHOGRAPHY MIRROR AND METHOD OF MAKING SAME

BACKGROUND OF THE INVENTION

The present invention relates to an improved aspheric mirror, and method of designing the same, for use in a lithographic system adapted to expose a workpiece, such as a semiconductor wafer, to a specified type of radiation, e.g., X-rays. More particularly, the invention relates to a mirror design that delivers uniform illumination over a narrow straight line suitable for use in a lithography system or as an input to a monochromator.

X-ray lithography is used as a means of processing solid state devices, such as semiconductor wafers. For example, lithography processes are used to form desired circuit and device patterns on the wafer as a particular semiconductor device is made. The rapidity and sharpness with which desired circuit and device patterns can be made using X-ray lithography is a function of the intensity and uniformity of the X-ray exposure of the wafer. Hence, as the demand for smaller and more dense semiconductor devices has increased, there has thus been a corresponding need for more intense and uniform exposure of the semiconductor wafer.

For most purposes, an X-ray source may be considered as a point source, with its radiation emitting in a ray fan from the point of origin. Hence, in using such radiation, a balance must be reached between the desire to use as much of the emitted radiation as possible, in order to minimize exposure times, and the desire to limit the variation of incidence angle across the exposed workpiece, which variation of incidence angle may cause undesirable variations in the power density of the X-ray. The angular limitation is typically accomplished by placement of the workpiece far from the X-ray source. This however is at the expense of reduced intensity and longer exposure time. What is needed, therefore, is a way to place the workpiece relatively close to the X-ray source, while capturing as much of the radiation as possible to uniformly expose the workpiece.

One way known in the art to direct as much of the X-ray radiation as possible towards the workpiece is through collimation. Collimation may be achieved, for example, through the use of a mirror, as shown, e.g., in FIG. 4 of U.S. Pat. No. 4,028,547. Unfortunately, while such mirror provides collimation of the X-ray beam in one direction, and thereby directs most of the beam to the workpiece, it does not necessarily uniformly expose the workpiece with the beam directed thereto. That is, the power distribution or intensity of the radiation within the collimated beam may vary through a cross section of the beam, thereby exposing the workpiece nonuniformly. Hence, what is needed is a mirror that will not only provide the needed collimation of the beam in one direction, such as the horizontal direction, but that will also uniformly focus the beam in another direction, such as the vertical direction.

Even if a mirror provides the requisite beam collimation in one direction and beam focussing in the other direction, however, thereby creating a substantially straight focal line of radiation on the workpiece, such radiation will not produce the desired uniform exposure of the areas of the workpiece it covers unless the straight focal line contains a substantially uniform linear power distribution. Hence, there is a need for a mirror that provides a straight focal line having a uniform linear power distribution. Further, if the straight focal line is scanned or swept across the workpiece to uniformly expose the entire surface area of the workpiece to the desired radiation, there is also a requirement that such scanning not compromise the straightness or uniformity of illumination of the focal line, i.e., the focal line must remain substantially straight and maintain its uniform linear power distribution at all locations of the scan or sweep.

A toroidal mirror with its two radii appropriately chosen may be used to inexpensively provide collimation in the horizontal direction and focusing in the vertical direction of an incident X-ray beam from a point source. Unfortunately, however, the focal line of the radiated energy on the workpiece from such a toroidal mirror is neither straight nor of uniform power distribution. Rather, even for a perfectly made toroidal mirror, the focal line is curved and spreads, and the curvature changes, as the line is scanned across the workpiece, thereby causing numerous aberrations that make the uniform and efficient exposure of the workpiece virtually impossible. Use of a toroidal mirror also requires that a vacuum window, used at the end of the beamline, either be designed to be large enough to accept the whole aberrated image (and thus be thick and lossy), or be designed smaller (in which case it can be thinner) but with more losses incurred on the window frame which would be non-uniform with respect to both position along the line and across the scan. What is clearly needed, therefore, is a new type of mirror that has been shaped and polished in a prescribed manner so as to correct for, eliminate, or minimize any optical aberrations that tend to curve or spread the focal line, both as it is imaged on the workpiece, and as it is scanned across the workpiece.

SUMMARY OF THE INVENTION

The present invention advantageously addresses the above and other needs by providing a technique or method for designing and making an aspheric mirror so that the mirror projects a straight focal line of X-rays onto a workpiece from a point source of X-rays. Moreover, such an aspheric mirror advantageously eliminates or minimizes any optical aberrations that would otherwise tend to curve the X-ray focal line as it is scanned across the workpiece. Hence, such a mirror may be used in an X-ray lithography system to efficiently expose a workpiece by simply tilting or rotating the mirror in an appropriate manner so as to cause the straight focal line to sweep across the workpiece.

In accordance with one aspect of the invention, a method for designing an aspheric mirror is provided that collimates a beam from a point source in one direction, e.g., the horizontal direction, and focuses the beam in the other direction, e.g., the vertical direction. The resulting collimated and focused beam thus creates the desired straight focal line at the workpiece. Once designed, the mirror surface is then polished using conventional computer controlled polishing techniques so as to realize the designed shape.

In accordance with another aspect of the invention, the design of the mirror shape needed to achieve the prescribed image is achieved by representing the mirror surface as at least a fourth order, and in some cases a fifth order, Maclaurin Series Polynomial (MSP), and by then adjusting the coefficients of such MSP to eliminate identified optical aberrations that would otherwise bend or spread a focal line at the workpiece. Advantageously, by using a mirror designed in this fashion in a lithographic (or equivalent) system, the amount of rotation needed to sweep the straight line image across a workpiece is much smaller than for a steeply curved line. In part because the rotation angle is so small, the change in shape of the straight line image caused by scanning is made negligible in such design.

One embodiment of the invention may thus be characterized as a method for designing an aspheric mirror. Such method broadly includes the steps of: (a) defining a mirror surface that focuses a point source of X-rays to a good quality focal line on a workpiece using a single reflection; and (b) polishing a mirror surface to have a shape as defined in step (a).

The method of defining the aspheric mirror surface in accordance with the invention includes: (1) representing the optical surface of the aspheric mirror by a fourth or fifth order Maclaurin series polynomial having coefficients $a_{ij}$ that are yet to be specified; (2) identifying specific coefficients $a_{ij}$ in the Maclaurin series polynomial that correspond to offending optical aberrations; and (3) determining values for the identified coefficients that minimize the offending optical aberrations. Such design method advantageously defines an optical surface for the aspheric mirror that is precisely defined. Numerically controlled machining and polishing techniques may then be used to make a mirror that has the defined surface. While mirrors made using such method do not have figure and finish tolerances equal to those obtained by simpler techniques for making flat surfaces, they are easily good enough for x-ray lithography and other applications requiring a straight focal line.

Another embodiment of the invention comprises a mirror made in accordance with the above design method.

Still another embodiment of the invention may be characterized as a method of uniformly exposing a workpiece to X-rays using such a mirror by: (a) focusing a point source of X-rays to a good quality straight focal line on the workpiece using a single reflection from the mirror; and (b) tilting the mirror so as to scan the focal line over the workpiece.

It is a primary feature of the invention to provide an optical aberration correction method in designing a mirror surface, e.g., an aspheric mirror surface. Such method utilizes a fourth order, or fifth order, Maclaurin Series Polynomial as needed to define the mirror surface, and adjusts the coefficients of such Maclaurin Series Polynomial as needed in order to minimize offending optical aberrations. Once thus defined, conventional computer controlled polishing may be used to polish the mirror surface so that it conforms to a surface defined by the revised Maclaurin Series Polynomial.

It is an additional feature of the invention to provide a mirror design that uniformly distributes illumination reflected therefrom along a straight line, which straight line may be directed to the surface of a workpiece, e.g., a semiconductor wafer. The workpiece, in turn, may then be uniformly illuminated by scanning the line over the surface of the workpiece. Advantageously, such scanning may be readily realized by simply tilting or rotating the mirror.

It is a further feature of the invention to provide a mirror design that permits the mirror to be used with an aperture plate which restricts the incoming radiation to a beam size and shape such that all of the beam is intercepted by the mirror for all positions within the scan range. Such a plate is used with all mirror designs known to applicant in order to avoid non-uniform intensity over the scan.

It is yet another feature of the invention to provide a method of designing an aspheric mirror so that the resulting mirror prevents undesirable spreading and curving of radiation reflected from its surface to a workpiece.

It is still an additional feature of the invention to provide a mirror design that produces a straight line image of reflected illumination on the surface of a workpiece, and wherein such line image remains substantially straight as the mirror is tilted or rotated a sufficient amount.

It is yet a further feature of the invention to provide a mirror design that efficiently scans a substantially exact rectangular area of a workpiece with X-rays (or other illumination) by simply rotating the mirror through a small angle about a rotation axis.

It is an additional feature of the invention to provide a mirror design method and resulting mirror that provides a sufficiently good quality straight line image of reflected light to allow such light to be readily directed through the narrow input slit of a monochromator, or similar device having a narrow input aperture.

BRIEF DESCRIPTION OF THE DRAWINGS

The above and other aspects, features and advantages of the present invention will be more apparent from the following more particular description thereof, presented in conjunction with the following drawings and appendices wherein:

FIGS. 2A and 2B show top (elevation) and side (plan) views, respectively, of a representative optical layout of the lithography system of FIG. 1 for particular numerical values;

FIG. 6A shows the image shape of an X-ray beam at the workpiece when reflected off of a standard toroidal mirror having ray trace points as defined in FIG. 4A;

FIG. 6B shows the image shape of an X-ray beam at the workpiece as formed by a mirror designed in accordance with the present invention to correct for the dominant aberration;

FIG. 6C shows the image shape as in FIG. 6B when the next largest aberration has been removed.

Figure 1:
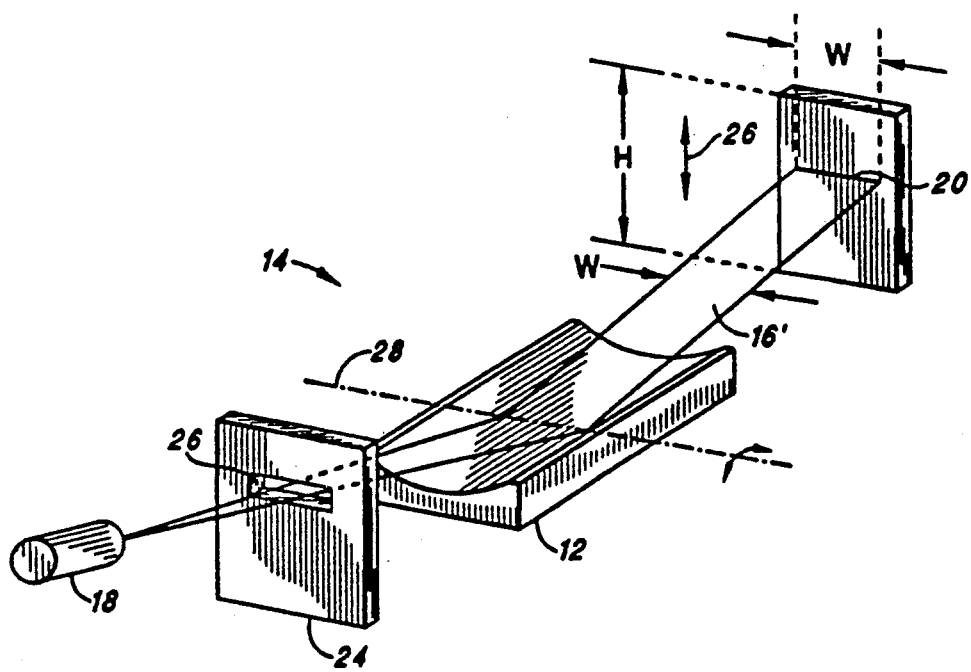
FIG. 1 diagrammatically shows an X-ray lithography system using an aspheric mirror designed and polished in accordance with the present invention.

Noda, et al. describes the basic approach used in diffraction grating theory, which approach is used herein to define the mirror surface.

Corresponding reference characters indicate corresponding components throughout the several views of the drawings.

DETAILED DESCRIPTION OF THE INVENTION

The following description is of the best mode presently contemplated for carrying out the invention. This description is not to be taken in a limiting sense, but is made merely for the purpose of describing the general principles of the invention. The scope of the invention should be determined with reference to the claims.

With reference to FIG. 1, the present invention relates generally to an aspheric mirror 12 used in an X-ray lithography system 14, and a method or technique for designing such a mirror. Advantageously, by using such a mirror, the lithography system 14 requires only a single mirror 12. This mirror 12 receives a fan beam of X-rays 16 from a point source of X-rays 18 and focuses such rays to a sharp, straight focal line 20 on a workpiece 22 that is to be exposed. The workpiece 22 may comprise, e.g., a semiconductor wafer that is being processed during the semiconductor manufacturing process. Beam-defining apparatus 24, positioned just a few centimeters from the mirror 12, includes a suitable aperture or slot 26 that limits the beam size without significant loss of the total X-ray flux. The fan beam of X-rays 16 thus passes through the aperture 26, strikes the mirror 12, and is reflected to the workpiece 22. The source of X-rays may be realized using a conventional electron storage ring, such as is commercially available from a few vendors, such as Maxwell Laboratories, of San Diego, California.

As seen in FIG. 1, it is the function of the mirror 12 to reflect and focus the fan beam 16 so that the reflected beam from the mirror, identified by the reference numeral 16′, is collimated to a specified length, W, in one direction and focused to the focal line 20 in the other direction. Thus, the focal line 20 has a length W at the workpiece 22. It is a further function of the mirror 12 to uniformly distribute the power or intensity of the X-ray beam along the length W of the focal line 20. Thus, the workpiece 22 may be uniformly exposed to the X-ray radiation by simply scanning the focal line 20 across the surface of the workpiece in the direction of the arrow 26. Such scan direction is generally orthogonal to the direction of the incident X-ray beam. It is generally preferred that the surface of the workpiece being scanned also be positioned substantially orthogonal to the incident beam.

In order to scan the focal line 20 across the surface of the workpiece 22, the mirror 12 is mounted for rotation about an axis 28 that is substantially orthogonal to the direction of beam travel. As the mirror 12 is rotated about this rotation axis 28, the focal line 20 moves up or down (as oriented in FIG. 1) across the surface of the workpiece, i.e, the focal line scans across or over the workpiece. Because there is a uniform power distribution along the focal line, and because of the small variation of the deflection angle of the X-rays, a single scan of the line across the workpiece thus uniformly exposes the surface of the workpiece to the desired radiation. The level of exposure of the workpiece may be easily controlled by controlling the speed of the scan and the number of scans.

It should be noted that while tilting or rotating the mirror 12 represents one possible approach for scanning the focal line 20 across the surface of the workpiece, other scanning techniques could be used. For example, the workpiece could be mounted for movement in the direction indicated by the arrow 26, thereby creating relative motion between the workpiece and the focal line. Alternatively, the focussing mirror could be kept fixed while the scan is carried out by rotation of a flat mirror.

Any suitable means may be used to achieve the rotation or tilting of the mirror 12 about the rotation axis 28, as are known and commonly practiced in the optical arts. For example, a typical method of mirror rotation, particularly when the mirror includes substantial mass, includes the use of a computer-controlled stepper motor that drives a linear slide coupled via vacuum bellows to a rotating arm attached rigidly to the mirror.

As explained more fully below, the advantageous result—of having the focal line 20 scan across the workpiece—only occurs when shape of the surface of the mirror 12 has been designed in an appropriate manner. If the mirror surface has not been shaped correctly, the focal line will not be straight, and the power density of the focal line will not be uniform to start with and will change as a function of the focal line's relative position on the workpiece. Hence, without a correctly designed mirror 12, it is not possible to uniformly expose the workpiece to the desired X-ray radiation by simply scanning the workpiece with the focal line.

It is noted that FIG. 1, as well as many of the other drawing figures included herein, are not drawn to scale. In particular, it should be noted that the angle of incidence of the X-ray beam 16 relative to the mirror surface is very large (near 90°), as is the angle of reflectance, such that the beam just glances off of the mirror surface to the workpiece. This is best illustrated in FIGS. 2A and 2B where there is shown top (elevation) and side (plan) views, respectively, of the optical layout of the lithography system of FIG. 1. Like FIG. 1, FIGS. 2A and 2B are not drawn to scale, but the dimensional numbers and angles presented in FIGS. 2A and 2B are representative of typical values that are used with a particular lithography system made in accordance with the present invention.

Referring to the particular optical layout of FIGS. 2A and 2B, it is seen that the nominal angle of incidence is 88.5°. The source (represented in FIGS. 2A and 2B as a point 18) is 2.25 meters from the rotation axis 28 of the mirror 12. The workpiece 22 is 9.75 meters from the mirror axis 28. The beam 16 fans out from the point source 18 at an angle of 29 milliradians in the horizontal direction and 1.4 milliradians in the vertical direction. The footprint of this beam on the mirror 12 is 65 mm wide and a little less than 300 mm long. The system is thus designed to collimate the reflected beam 16′ to a width of 65 mm. Hence, the length of the focal line 20, or the distance W shown in FIG. 1, is also approximately 65 mm. The scan distance or scan height H of the focal line on the workpiece surface is on the order of 25 mm. It is to be emphasized that these distances and dimensions are only representative of a typical lithography system. The particular dimensions used for any given optical layout will be governed by the particular application for which the X-ray lithography system is to be used.

Figure 3A:
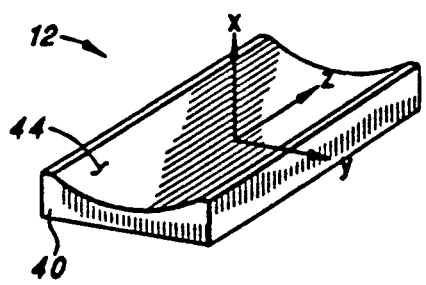
FIGS. 3A, 3B and 3C show an isometric view, end view, and top view, respectively, of an aspheric mirror, and also show how an x-y-z coordinate system is defined relative to the geometry of such a mirror for purposes of the present application.
Figure 3C:
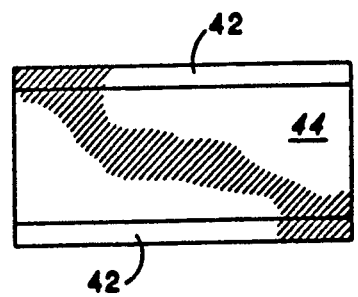
Figure 3B:
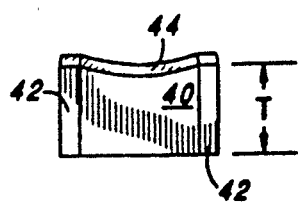

FIGS. 3A, 3B and 3C show an isometric view, end view, and top view, respectively, of the mirror 12 that is used with the lithographic system 14 shown in FIG. 1. Included in FIG. 3A is an X-Y-Z coordinate system that defines an x, y and z direction relative to the geometry of the mirror 12 for purposes of the present invention. As seen in these figures, the mirror 12 includes a rectangular base or substrate 40 having a thickness T. For the particular example shown in FIG. 2A, the surface of the mirror 12 has a length of about 30 cm and a width of about 75 mm. A typical thickness for the mirror 12 having dimensions as described above may be on the order of 50 mm. The substrate and mirror surface may be made from any suitable material, such as plated metal if cooling is required, or glass or fused silica if cooling is not required. An optical coating of a heavy metal such as gold, rhodium, platinum, etc., is applied to the mirror surface after polishing to achieve high X-ray reflecting efficiency.

A toroidal mirror would initially appear as a good mirror to use with a single-mirror X-ray lithography system because such a mirror can in principle provide the desired collimation of the beam in one direction, e.g., the horizontal direction, and focussing in the other direction, e.g., the vertical direction. However, as will be clearly evident from the description that follows in connection with FIG. 5, such a conventional toroidal mirror falls far short of providing the requisite uniform focusing of the beam to a good straight line.

Figure 4A:
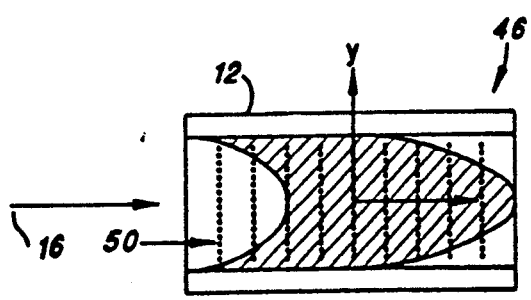
FIG. 4A illustrates how a matrix of ray trace points are defined on the surface of an aspheric mirror.

To help in the explanation of the invention, it is convenient to define an array or matrix of ray trace points 46 located on the surface of the mirror, as shown in FIG. 4A. For the orientation of the mirror depicted in FIG. 4A, nine columns of fifteen ray trace points each are shown, making a total of 135 ray trace points, equally spaced on a rectangular grid. It is to be understood that this number of points is only exemplary. It is further noted that "ray tracing" is a standard process used in optical design that is well understood by those skilled in the art. See, e.g., Kastner et al., *J. Opt. Soc. Am.*, Vol. 53, 1180 (1963); Spencer et al., *J. Opt. Soc. Am.*. Vol. 52, 672 (1962); Cerrine, F. *Proc. SPIE*, Vol. 503, 60 (1984).

Figure 4B:
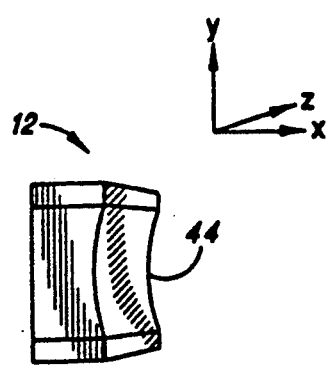
FIG. 4B shows that portion of the surface area of the mirror of FIG. 4A that receives (and reflects) the part of the original beam passed by the aperture (element 6) in FIG. 1.

FIG. 4B shows the surface 44 of the mirror 12 as seen looking generally in the direction of the incident X-ray beam. From this angle, it is seen that the reflective surface area of the mirror appears much smaller due to foreshortening.

Figure 5:
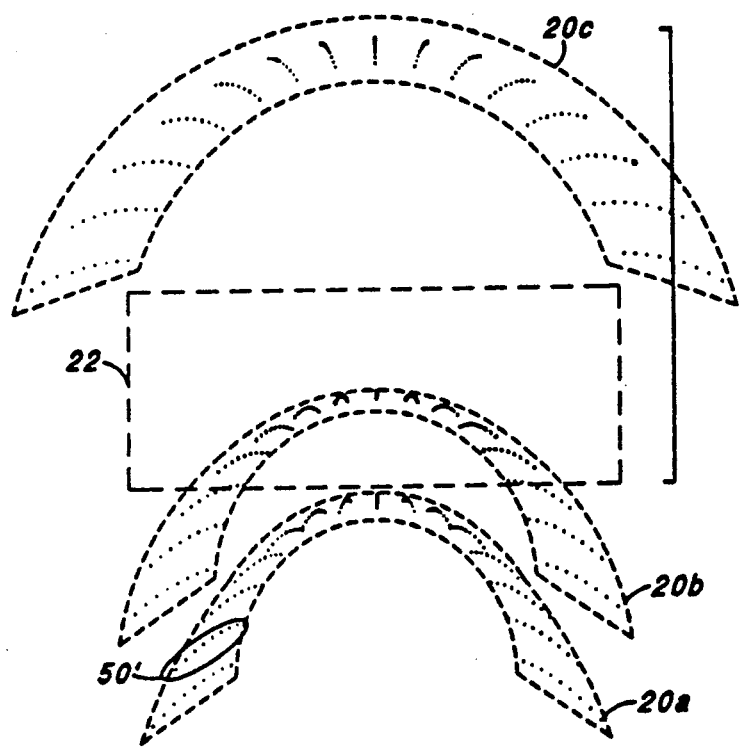
FIG. 5 illustrates the effect of using a standard toroidal mirror to scan a workpiece, and highlights how the curved focal line changes shape as a function of scan location.

FIG. 5 shows the effect of using a standard toroidal mirror to scan a workpiece. FIG. 5 shows the surface of the workpiece 22, having approximate dimensions of 65 mm by 25 mm. Included in FIG. 5 is the image, shown as a pattern of "dots" that represent the arrival points of rays at the workpiece. Thus, for example, the group 50′ of ray trace points (comprising nine dots near the bottom left side of FIG. 5) on the workpiece 22 corresponds to rays that came from the source via a horizontal row 50 of nine ray trace points included within the matrix 46 of ray trace points on the mirror surface. The 135 dots that are surrounded by the dashed line 20a near the bottom of FIG. 5 thus represent the "focal line" of the X-ray beam 16′ that reflects off of the mirror surface for a particular angle of incidence. Two other "focal lines", 20b and 20c, are also shown in FIG. 5 for other angles of incidence. The three focal lines 20a, 20b, and 20c thus represent the bottom extremity, center, and top extremity, respectively, of the scan across the workpiece 22.

As clearly seen in FIG. 5, the "focal line" 20a from a conventional toroidal mirror is neither straight nor sharp and is highly unsatisfactory for exposing the workpiece 22. Rather, it is highly spread and curved. Further, as also shown in FIG. 5, as the angle of incidence of the incoming rays relative to the mirror is changed, i.e., as the mirror is tilted in order to scan the focal line 20a across the surface of the workpiece, the focal line shape changes. Thus, for example, the curved focal line 20b, which represents the focal line at the workpiece for a slightly different angle of incidence, is not the same shape as the focal line 20a. Similarly, the focal line 20c is not the same shape as either the focal line 20a or 20b. Such changes in shape not only lead to a non-uniform exposure of the workpiece, but also require an enlarged angular excursion of the mirror position if all the X-rays in the pattern are to be fully swept across the workpiece. The changes in shape also cause further performance degradation by preventing an optimum design of the vacuum window, as described previously.

Hence, as clearly evident from FIGS. 4A, 4B and FIG. 5, the conventional toroidal mirror does not efficiently scan the workpiece 22. This is because in order to sweep the whole X-ray image across the entire surface of the workpiece, one must scan the height of the workpiece (25 mm) plus the height of the curved focal line (about 30 mm), totalling about 55 mm. Thus, in order to scan a workpiece having a height of 25 mm, a total scan distance of more than twice that amount, 55 mm in the present example, must be traversed. The X-rays that do not impinge on the surface of the workpiece during this scan operation represent wasted X-ray energy and time, and significantly decrease the efficiently of the scan operation.

In view of the inefficiencies associated with scanning the workpiece 22 with a conventional toroidal mirror, both relative to exposure uniformity and scan distance, it is apparent that what is needed is a technique for straightening the focal line at the workpiece. If the focal line could be made relatively straight at the workpiece, then the scan distance could be roughly equal to the height of the workpiece, and substantially all of the energy in the X-ray beam could be applied to the desired scan area. Advantageously, the present invention provides such a technique.

A mirror surface is designed in accordance with the present invention by first representing the optical surface of the mirror by at least a fourth order, and preferably a fifth order, MaClaurin Series Polynomial (MSP), as explained below. The coefficients of such MSP are then selected, as also explained more fully below, so as to eliminate or at least minimize any optical aberrations. (Note: for purposes of this invention, an optical aberration is any departure from the desired straight line.) The mirror surface is then polished so that it conforms to the mirror surface defined by the modified MSP. Advantageously, such polishing may be carried out using conventional computer controlled polishing techniques, currently practiced by numerous mirror manufacturers, such as Tinsley Laboratories of Richmond, California; or Hughes Aircraft of Danbury, Connecticut.

The process of designing the mirror surface in accordance with the present invention may advantageously be performed utilizing the standard theory of the diffraction grating. The diffraction grating theory may be used because a mirror is a special case (the wavelength tending toward zero) of a grating. Such theory has been treated by many authors, and is thus well known in the art. See, e.g., Noda et al., "Geometric Theory of the Grating", *Journal of the Optical Society of America.* Vol. 64, No. 8, pp 1031-36 (August 1974), and incorporated herein by reference. The approach taken in Noda et al. (1974) to design a diffraction grating is the same approach that may be used to design a mirror surface in accordance with the present invention. Thus, in the discussion of the mirror design method below, the same treatment and notation used by Noda et al. (1974) are used, expect where otherwise stated.

As indicated in Noda et al. (1974), the design method begins by expressing the optical path function as a power series in the optical aperture co-ordinates (w,l), which coordinates are in the plane of the grating (or, in this case, the Y-Z plane of the mirror surface). The shape of the reflecting surface is then represented by a two-dimensional Maclaurin Series polynomial of the form:

$$x = \Sigma \, a_{ij} Y^i z^j \qquad (a)$$

Note that such a polynomial relates an unknown variable x to known variables y and z which, as indicated, are coordinates in the plane of the mirror (Y-Z plane). For purposes of this invention, it has been found that such MSP may generally be limited to $(i+j) < 6$, i.e., the MSP is a fifth order or less MSP. However, should a case arise in which higher order MSP is required, the principles set forth herein are still valid and may be used to practice the invention.

It is to be noted that the X-Y-Z coordinate system of the mirror is as described in FIGS. 3A and 4A. The origin of the coordinate system is in the center of the mirror. Thus, y and z can have both positive and negative values. The origin of the coordinate system is defined such that the value of x, on the other hand, has only positive values. That is, the origin or center of the mirror represents the lowest point of the mirror surface (which is what one would expect for a concave mirror) relative to the top of the edges 42 of the mirror. At the low point the mirror surface is also parallel to the Y-Z plane. These two conditions dictate that $a_{00} = a_{01} = a_{10} = a_{11} = 0$. As the surface of the mirror slopes up to the edges of the mirror, the value of x becomes more positive.

When Eq. (a) above (which is equivalent to Eq. (4) in Noda et al.) is expanded for the optical path function, the result is Eq. (13) of Noda et al., the terms of which are specified by Eqs. (14)-(31) of Noda et al. Advantageously, each term of the series represents a recognizable geometrical optical aberration. Thus, to achieve ideal point-to-point imaging, all the aberration terms, that is those of order $(i+j) > 2$, would have to be zero, where $F_{ijk}$ is defined in Eq. (14) of Noda et al. Further, for the image to be in focus in the in-plane direction (vertical plane as oriented in FIGS. 1 and 2B), $F_{200}$ would have to be zero. Moreover, for the image to be in focus in the horizontal plane, $F_{020}$ would also have to be zero. However, for purposes of the present invention, collimation is desired in the horizontal direction, not focussing. Hence, it is necessary that $F_{020} \neq 0$.

An initial goal of the mirror design is for all aberration terms $F_{ijk}$ up to the fourth order $(i+j+k \leq 4)$ be zero. Such goal can be achieved as a matter of optical design by setting the appropriate expression for $F_{ijk}$ given in Noda et al. to zero. Since the $a_{ij}$ coefficients are involved in the terms that are to be set to zero, this process is facilitated by making the terms of the most important aberrations equal to zero through proper choice of the $a_{ij}$ coefficients. Note that each $a_{ij}$ coefficient is at least involved in correcting the $(i,j)^{th}$ aberration.

Once the surface shape has been defined by these $a_{ij}$ coefficients (selected to set the corresponding aberration terms, $F_{ijk}$, to zero), the performance of the surface shape is evaluated by exact ray tracing techniques. For X-ray lithography applications, the goal is to have a straight focal line within 1-2 mm and uniform illumination within a few percent over the defined length of the focal line. If a certain aberration is found to be non-zero, say the $(i,j)^{th}$ aberration, then the position in the image of the ray from the corresponding (w,l) point in the aperture is displaced from its ideal arrival point (the Gaussian image of the object point) by $\Delta y'$ in the vertical and $\Delta z'$ in the horizontal directions. The terms $\Delta y'$ and $\Delta z'$, also referred to as the "ray aberrations", are given by $$\Delta y' = \frac{r'}{\cos\beta} \frac{\partial G_{ijk}}{\partial w} \qquad (b)$$

$$\Delta z' = r' \frac{\partial G_{ijk}}{\partial l} \qquad (c)$$

where $G_{ij}$ is the $(i,j,k)^{th}$ term of Noda et al.'s Eq. (13). (For example, $G_{120} \equiv \frac{1}{2} w l^2 F_{120}$.)

The relationships (b) and (c) above illustrate the (w,l) dependance of the aberration of the rays arriving at the image plane; and thus advantageously allow the optical designer to recognize the aberration responsible for any observed image imperfections present in the ray trace image.

The values of the $a_{ij}$ coefficients up to the fourth order that eliminate the (i,j) aberrations have been derived from the equations given by Noda et al. Ray tracing of particular examples has then been used to demonstrate that all the aberrations which are significant in cases of interest in lithography do indeed go to zero (i.e., are "corrected"). These values of $a_{ij}$ coefficients are given below in TABLE 1.

For purposes of the present invention, the line curvature aberrations are of particular concern. To recognize these, it is noted that $$\Delta z' = r' l (S(r,\alpha) + S(r', -\alpha)) \qquad (d)$$

which is derived from Eq. (19a) of Noda et al. and Eq. (c), above. In order to correct for the lowest order curvature, any terms of Eq. (13) of Noda et al. which give (after use of Eq. (d) to eliminate l) a $\Delta y'$ proportional to $\Delta z'^2$ are identified. Three such terms qualify, namely $F_{120}$, $F_{102}$ and $F_{111}$. (Note, see Eq. (14) of Noda et al. for the definition of the $F_{ijk}$ term. Note also that to get the $F_{102}$ term, which Noda et al. do not include explicitly, the square root in the $F_{100}$ term has to be expanded.) These terms are combined to determine an $a_{12}$ coefficient that corrects the curvature to this order. This coefficient is determined to be:

$$a_{12} = \frac{1}{4} \tan\alpha \left( \frac{2(S + S')}{r} - (S + S')^2 + \frac{S}{r} - \frac{S'}{r'} \right) \qquad (e)$$

Other $a_{ij}$ coefficients are determined in similar manner to be:

$$a_{20} = \frac{\cos\alpha}{4 f_T} \qquad (f)$$

-continued $$a_{02} = \frac{1}{4f_S \cos\alpha} \quad (g)$$

where $f_T$ and $f_S$ are the tangential and sagittal focal lengths, respectively, and $$a_{30} = \frac{1}{4} \tan\alpha \left( \frac{T}{r} - \frac{T'}{r'} \right) \quad (h)$$

$$a_{40} = \quad (i)$$

$$\frac{1}{16\cos\alpha} \left\{ 4\sin^2\alpha \left( \frac{T}{R^2} - \frac{T'}{r'^2} \right) - \left( \frac{T^2}{r} + \frac{T'^2}{r'} \right) + \right.$$

$$\left. 4a_{20}^2 \left( \frac{1}{r} + \frac{1}{r'} \right) - 4a_{30}\sin 2\alpha \left( \frac{1}{r} - \frac{1}{r'} \right) \right\}$$

$$a_{04} = \frac{1}{16\cos\alpha} \left\{ 4a_{02}^2 \left( \frac{1}{r} + \frac{1}{r'} \right) - \left( \frac{S^2}{r} + \frac{S'^2}{r'} \right) \right\} \quad (j)$$

$$a_{22} = \quad (k)$$

$$\frac{1}{8\cos\alpha} \left\{ 2\sin^2\alpha \left( \frac{S}{r^2} + \frac{S'}{r'^2} \right) - \left( \frac{TS}{r} + \frac{TS'}{r'} \right) + \right.$$

$$\left. 4a_{20}a_{02} \left( \frac{1}{r} + \frac{1}{r'} \right) - 2a_{12}\sin 2\alpha \left( \frac{1}{r} - \frac{1}{r'} \right) \right\}$$

Once the aberrations (up to fourth order) have been eliminated, the only aberrations that remain that are large enough to harm the straightness and sharpness of the focal line for purposes of the present invention, assuming the tolerances expressed above, are fifth order. Through examination of ray traces, it is observed that a curvature of the type $\Delta y'$ proportional to $\Delta z'^4$ is often present. To correct for this aberration, a process similar to that used above to determine the $\Delta z'^2$ curvature is used, and a determination is made that the $F_{104}$, $F_{113}$, $F_{122}$, $F_{131}$ and $F_{140}$ terms of the series are responsible. By extending the analytical work of Noda et al., these terms have been determined and it has been observed that only the $F_{140}$ term contains an a coefficient, namely the $a_{14}$ coefficient. Through use of a factor in front of the $a_{14}$ coefficient, and by using equations (c) and (d) above, it is observed that the change in $\Delta a_{14}$ needed to shift the ends of a curved line at $\Delta z'$ from line center by the amount $\Delta y'_{1c5}$ needed for straightening is given by:

$$\Delta a_{14} + \Delta y_{1c5} \left[ \frac{(r')^3 (S(r,\alpha) + S(r', -\alpha))^4}{2\Delta z'^4} \right] \quad (m)$$

Equation (m) thus enables the optical designer to correct a curvature $\Delta y' \, \alpha \Delta z'^4$ when such aberration is observed in the ray trace.

A further strategy that may be used to straighten the focal line is to introduce a lower order aberration that at least partially cancels a higher order one. This technique is known as "aberration balancing". Aberration balancing allows the size of aberrations to be diminished, but does not eliminate them all together.

As an example of aberration balancing, it is possible to partly correct a $\Delta y'$ proportional to $\Delta z'^4$ curvature by deliberately introducing a $\Delta y'$ proportional to $\Delta z'^2$ curvature of opposite sign. The result is a focal line that has a slight "m" shape, but which may be closer to the desired straight line shape than a curve to the fourth power.

It is to be emphasized that once a mirror surface has been designed as described above, i.e., once the surface has been defined by a Maclaurin Series Polynomial that has the $a_{ij}$ coefficients adjusted to eliminate aberrations, a mirror can be readily made that has such a surface by using conventional numerically controlled machining and polishing techniques. Several advantageous results are achieved with such a mirror. First, the surface of the mirror is always a polynomial of finite order and therefore always exists and is continuous with continuous derivatives. Second, with such a mirror there is essentially no limit to the values of i and j that one can use. That is, there is essentially no limit to the types of aberrations that can be removed. Further, because of the manner in which the mirror is manufactured, i.e., by computer control, higher values of i and j do not make the manufacturing of the mirror more difficult.

Figure 6D:
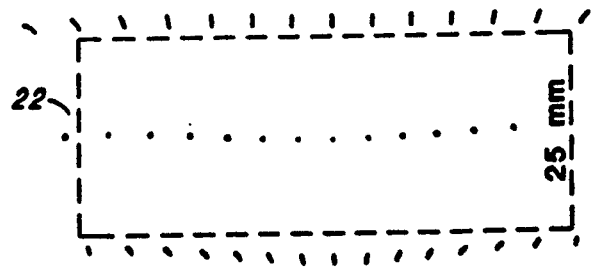
FIG. 6D shows the image shape as in FIG. 6C with all fourth order aberrations corrected and with some balancing of the largest 5th order aberration, resulting in an image shape that is a respectable approximation of a straight line.

To illustrate the effectiveness of using the present invention to design a mirror surface, reference is next made to FIGS. 6A–6D where there is shown a sequence of focal line images obtained by successively correcting for important aberrations. FIG. 6A shows the image shape of the X-ray beam at the workpiece when reflected off of a standard toroidal mirror having ray trace points as defined in FIG. 4A. In other words, the very poor approximation to a focal line image shown in FIG. 6A results from a toroidal mirror. Assuming a lithography system having approximate dimensions as shown in FIGS. 2A and 2B, the image shape shown in FIG. 6A has a length of about 65 mm and a height of 28 mm. In contrast, the ideal focal line image shape would have a length of about 65 mm and a width of 1–2 mm. The image is presented in FIG. 6A is uncorrected, while adjacent FIGS. 6B–6D provide a reference images so that the improvement realized by using a mirror designed in accordance with the invention is evident.

FIG. 6B shows the focal line image at the workpiece when the dominant aberration (astigmatic coma) has been corrected. The image shape shown in FIG. 6B, assuming a lithography system having dimensions as indicated in FIGS. 2A and 2B, has a width on the order of 70 mm, and a height of approximately 5 mm. This is a vast improvement over the uncorrected image shown in FIG. 6A, but still not the ideal line image.

FIG. 6C shows the focal line image at the workpiece when the next largest aberration (a combination of coma and defocus) has been corrected. The image shape shown in FIG. 6C, again assuming a lithography system having dimensions as shown in FIGS. 2A and 2B, has a width of about 69 mm, and a height of about 2 mm. The image of FIG. 6C is thus almost the desired straight line image.

FIG. 6D shows the focal line image at the workpiece when the only remaining low order aberration (primary coma) has been corrected. Note that the image shape shown in FIG. 6D is a respectable approximation to a straight line. Using a lithography system having the approximate dimensions shown in FIGS. 2A and 2B, the line shown in FIG. 6D has a width of about 69 mm, and a height of about 1 mm. This focal line is thus very close to the ideal straight line image.

As seen in the sequence of images shown in FIGS. 6A-6D, the length of the focal line undergoes slight changes as the scan is made. This effect applies to all systems using a scanned focussing mirror and is due to changes that occur in the astigmatism of the mirror relative to the grazing angle. Fortunately, such effect can be readily corrected, if necessary, because it is linear as a function of the angle. Thus, by applying small adjustments to the scan rate as a function of angle, the effect can be corrected.

It is to be emphasized that the sequence of images shown in FIGS. 6A-6D does not represent an iterative design process. That is, while the gradual removal of one aberration at a time is illustrative for explaining the design principles of the invention, it is to be emphasized that the design method of the present invention removes all of the aberrations at once, using the equations (a)-(m) and techniques described above.

By using the process described above in order to design a mirror surface that produces a substantially straight focal line image, the number of coefficients in the 5th order Maclaurin Series Polynomial (MSP) chosen to have non-zero values is eight. The other coefficients of the MSP are eliminated, mostly by symmetry. The values of the eight remaining coefficients, are summarized in TABLE 1 for a lithography system having dimensions as shown in FIGS. 2A and 2B.

TABLE 1

| Maclaurin Series Coefficients | |
|---|---|
| Coefficient | Value* |
| $a_{20}$ | $3.580 \cdot 10^{-5}$ |
| $a_{02}$ | $4.245 \cdot 10^{-2}$ |
| $a_{04}$ | $9.4066 \cdot 10^{-5}$ |
| $a_{30}$ | $6.117 \cdot 10^{-8}$ |
| $a_{12}$ | $1.1161 \cdot 10^{-4}$ |
| $a_{14}$ | $7.13 \cdot 10^{-7}$ |
| $a_{22}$ | $3.673 \cdot 10^{-7}$ |
| $a_{40}$ | $1.715 \cdot 10^{-10}$ |

*units for all coefficients in Table 1 are $cm^{-(i+j-1)}$

As described above, it is thus seen that the present invention provides a method for designing a mirror surface that corrects for optical aberrations. Such method utilizes a fifth order Maclaurin Series Polynomial to define the mirror surface, with the coefficients of such Maclaurin Series Polynomial being defined so as to eliminate or minimize offending optical aberrations. Once the mirror surface has been thus defined, conventional computer controlled polishing is used to polish the mirror surface so that it conforms to the designed surface.

As further described above, it is seen that the present invention provides a mirror design that uniformly distributes illumination, e.g., X-ray radiation, reflected therefrom along a straight line. Further, this straight line, when imaged on a workpiece, remains substantially straight as the line is scanned across the workpiece. Thus, the straight line image of the radiation, when directed to and scanned across the surface of the workpiece, e.g., a semiconductor wafer, uniformly exposes the workpiece. Advantageously, such scanning may be readily realized by simply tilting or rotating the mirror.

As also seen from the above, the present invention improves significantly the efficiency of an X-ray lithography system, or other system using a mirror designed as described herein, over prior art systems. This improvement results not only because of the above-mentioned scanning and illumination uniformity, but also because the mirror design permits the mirror to be used with an aperture plate that restricts the incoming radiation to a beam size and shape that causes all of the incoming beam to be intercepted by the mirror for all positions within the scan range.

While the invention herein disclosed has been described by means of specific embodiments and applications thereof, numerous modifications and variations could be made thereto by those skilled in the art without departing from the scope of the invention set forth in the claims.

What is claimed is:

1. A method for uniformly exposing a workpiece to X-rays comprising:
    (a) designing a surface of an aspheric mirror to produce a straight line image of radiation reflected therefrom on a workpiece, said straight line having the radiation uniformly distributed along its length;
    (b) focusing a source of X-rays from the surface of said aspheric mirror to a straight line of X-ray radiation on the workpiece; and
    (c) scanning the line of X-ray radiation across the workpiece, thereby efficiently exposing the workpiece to the X-ray radiation.

2. The method as set forth in claim 1 wherein step (c) includes rotating the aspheric mirror through a scan angle so as to cause the line of X-ray radiation to scan across the workpiece.

3. The method as set forth in claim 1 wherein step (c) includes maintaining the line of X-ray radiation stationary while translating the workpiece, thereby scanning the workpiece relative to the line of X-ray radiation.

4. The method as set forth in claim 1 wherein step (c) includes reflecting the line of X-ray radiation off of a flat mirror prior to directing it to the workpiece, and rotating the flat mirror through a scan angle.

5. The method as set forth in claim 1 wherein step (b) further includes passing the radiation from said source of X-rays through an aperture slot prior to reflecting said radiation from the surface of said aspheric mirror, said aperture slot having dimensions that restrict the radiation to a beam size and shape that causes all of the radiation to be intercepted by the surface of the aspheric mirror for all positions within the scan angle.

6. The method as set forth in claim 1 wherein step (a) comprises:
    (1) representing the optical surface of the aspheric mirror by at least a fourth-order Maclaurin series polynomial having coefficients a yet to be specified;
    (2) identifying specific coefficients $a_{ij}$ in the Maclaurin series polynomial that correspond to offending optical aberrations;
    (3) selecting values for the specific coefficients identified in step (2) that minimize the offending optical aberrations;
    whereby the optical surface of the aspheric mirror is defined by the Maclaurin series polynomial that has the specific coefficients a identified in step (2), each having the specific values determined in step (3).

7. A method of making an aspheric mirror so that a fan X-ray beam from a point source is reflected off of the surface of the aspheric mirror to a sharp, substantially straight line on a workpiece, said method comprising:
    (a) defining a mirror surface that focuses a point source of X-ray radiation to a straight focal line on a workpiece using a single reflection, said straight focal line including a uniform distribution of the X-ray radiation along it length; and (b) machining and polishing a mirror surface to have a shape as defined in step (a).

8. The method as set forth in claim 7 wherein the step of defining the mirror surface comprises:

(1) representing the optical surface of the aspheric mirror by at least a fourth-order Maclaurin series polynomial having coefficients $a_{ij}$ yet to be specified;

(2) identifying specific coefficients $a_{ij}$ in the Maclaurin series polynomial that correspond to offending optical aberrations; and (3) determining values for the specific coefficients identified in step (2) that minimize the offending optical aberrations;

whereby the optical surface of the aspheric mirror is defined by the Maclaurin series polynomial having the specific coefficients $a_{ij}$ identified in step (2), each having the values determined in step (3).

9. The method as set forth in claim 8 wherein step (2) includes selecting the values of $a_{ij}$ to belong to the set $(i+j) < n$, where n is an integer selected to yield a specified straightness of the focal line.

10. The method as set forth in claim 9 wherein the value of n is selected to be greater than or equal to four.

11. The method as set forth in claim 8 wherein step (3) includes setting $a_{00} = a_{01} = a_{10} = a_{11} = 0$.

12. The method as set forth in claim 11 further including:

expanding the Maclaurin series polynomial to obtain a series of terms, which terms include the coefficients $a_{ij}$, setting the terms of the Maclaurin Series polynomial up to the fourth order equal to zero, and solving each term to determine a value of the coefficient $a_{ij}$ that causes the term to be zero.

13. The method as set forth in claim 12 wherein the selected coefficients of the Maclaurin series polynomial include $a_{20}$, $a_{02}$, $a_{04}$, $a_{30}$, $a_{22}$ and $a_{40}$.

14. The method as set forth in claim 13 wherein the selected coefficients further include $a_{14}$.

15. The method as set forth in claim 8 further including evaluating the design of the mirror surface as defined by the Maclaurin series polynomial with said specific coefficients a having said determined values using ray tracing techniques.

16. An aspheric mirror made in accordance with the method of claim 8.

17. A method of making an aspheric mirror having a surface so that a fan X-ray beam from a point source is reflected off of the surface to a sharp, substantially straight line on a workpiece, said method comprising the steps of:

(1) representing the optical surface of the aspheric mirror by a Maclaurin series polynomial having coefficients $a_{ij}$ yet to be specified;

(2) identifying specific coefficients $a_{ij}$ in the Maclaurin series polynomial that correspond to offending optical aberrations;

(3) selecting values for the specific coefficients identified in step (2) that minimize the offending optical aberrations; and (4) machining and polishing a mirror surface using numerically controlled machining and polishing techniques as defined by the Maclaurin series polynomial having the specific coefficients $a_{ij}$ identified in step (2), each having the values determined in step (3).

* * * * *

UNITED STATES PATENT AND TRADEMARK OFFICE
CERTIFICATE OF CORRECTION

PATENT NO. : 5,214,685
DATED : 5/25/93
INVENTOR(S) : Howells

It is certified that error appears in the above-identified patent and that said Letters Patent is hereby corrected as shown below:

Column 4, line 49, change "6" to --26--. Column 7, line 40, change "Am.." to --Am.,--. Column 9, line 1, after "America", change the period to a comma. Column 10, line 25, change "$F_{120°}$)" to --$F_{120°}$.)--. Column 11, line 48, change "a" to --$a_{ij}$--. Column 11, line 61, change "$\alpha \Delta z^{14}$" to --$\propto \Delta z^{14}$--. IN THE CLAIMS: Column 14, lines 50 and 60, Claim 6, change "a" to --$a_{ij}$--. Column 16, line 7, Claim 13, after "$a_{30}$," insert --$a_{12}$,--. Column 16, line 13, Claim 15, change "a" to --$a_{ij}$--.

Signed and Sealed this

First Day of February, 1994

BRUCE LEHMAN

Attest:

Attesting Officer

Commissioner of Patents and Trademarks